(12) United States Patent
Selvamanickam et al.

(10) Patent No.: US 7,071,148 B1
(45) Date of Patent: Jul. 4, 2006

(54) JOINED SUPERCONDUCTIVE ARTICLES

(75) Inventors: Venkat Selvamanickam, Wynantskill, NY (US); Yi-Yuan Xie, Guilderland, NY (US); Allan Robert Knoll, Guilderland, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 11/102,043

(22) Filed: Apr. 8, 2005

(51) Int. Cl.
*B32B 7/04* (2006.01)
*H01B 12/00* (2006.01)
*H01L 39/22* (2006.01)

(52) U.S. Cl. .................. 505/234; 505/220; 505/236; 505/470; 505/927; 428/930; 174/125.1; 252/500

(58) Field of Classification Search ............... 505/234, 505/220, 236, 470, 927; 174/125.1; 428/930; 252/500
See application file for complete search history.

(56) References Cited

U.S. PATENT DOCUMENTS

| | | | | |
|---|---|---|---|---|
| 5,843,584 A | * | 12/1998 | Raber | 428/594 |
| 5,912,607 A | * | 6/1999 | Kalsi et al. | 335/216 |
| 6,159,905 A | * | 12/2000 | Buzcek et al. | 505/234 |
| 6,561,412 B1 | * | 5/2003 | Maeda et al. | 228/262.1 |
| 6,765,151 B1 | * | 7/2004 | Fritzemeier et al. | 174/125.1 |

FOREIGN PATENT DOCUMENTS

EP 545608 A2 * 6/1993
WO WO 80/02084 * 10/1980

OTHER PUBLICATIONS

O. Herbelot, et al., "Superconducting Cable Joint Resistance", IEEE Transactions on Magnetics, vol. 27, No. 2, Mar. 1991, pp. 1850-1853.
P. A. Klaudy, et al., "Practical Conclusions From Field Trials of a Superconducting Cable", IEEE Transactions on Magnetics, vol. MAG-19, No. 3, May 1983, pp. 656-661.
K. G. Herd, et al., "Development and Fabrication of a Bi-2223 Racetrack Coil for Generator Applications", IEEE Transactions on Applicatied Superconductivity, vol. 7, No. 2, Jun. 1997, pp. 531-534.

* cited by examiner

*Primary Examiner*—Mark Kopec
*Assistant Examiner*—Kallambella Vijayakumar
(74) *Attorney, Agent, or Firm*—Larson Newman Abel Polansky & White, LLP

(57) ABSTRACT

A superconducting article includes a first superconductive segment having a nominal thickness $t_{n1}$, a second superconductive segment having a nominal thickness $t_{n2}$, and a joint region comprising a splice connecting the first and second superconductive segments together. The splice overlies portions of both the first and second superconductive segments along the joint region, the joint region having a thickness $t_{jr}$, wherein $t_{jr}$ is not greater than at least one of 1.8 $t_{n1}$ and 1.8 $t_{n2}$.

19 Claims, 5 Drawing Sheets

JOINED SUPERCONDUCTIVE ARTICLES

CROSS-REFERENCE TO RELATED APPLICATION(S)

BACKGROUND

1. Field of the Invention

The present invention is generally directed to superconductive articles and methods for forming same. The invention is particularly related to superconductive articles in the form of joined coated conductors, and devices incorporating same.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3–10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

SUMMARY

According to a first aspect, a superconductive conductor, particularly a superconductive article, includes a first superconductive segment having a nominal thickness $t_{n1}$, a second superconductive segment having a nominal thickness $t_{n2}$, and a joint region comprising a splice connecting the first and second superconductive segments together. The splice overlies portions of both the first and second superconductive segments along the joint region, the joint region having a thickness $t_{jr}$, wherein $t_{jr}$ is not greater than at least one of 1.8 $t_{n1}$ and 1.8 $t_{n2}$.

According to another aspect, a superconducting article includes a first superconductive segment having a first segment end portion, the first segment end portion having reduced thickness $t_{r1}$, a second superconductive segment having a second segment end portion, the second segment end portion having reduced thickness $t_{r2}$, and a joint region comprising a splice connecting the first and second superconductive segments together. The splice overlies the first and second segment end portions.

According to another aspect, a superconducting article includes a first superconductive segment having a first segment end portion, the first superconductive segment having a nominal thickness $t_{n1}$ and the first segment end portion having reduced thickness $t_{r1}$ that is less than $t_{n1}$, a second superconductive segment having a second segment end portion, the second superconductive segment having a nominal thickness $t_{n2}$ and the second segment end portion having reduced thickness $t_{r2}$ that is less than $t_{n2}$, wherein the first and second end portions are bonded together at a joint region. The joint region has a thickness $t_{jr}$ that is not greater than at least one of 1.8 $t_{n1}$ and 1.8 $t_{n2}$.

According to another aspect, a superconducting article includes a first superconductive conductor having a nominal thickness $t_{n1}$, and a second superconductive conductor overlying the first conductor along a joint region, the joint region having a thickness not greater than 1.8 $t_{n1}$.

According to another aspect, a superconducting article includes a first superconductive segment comprising a first substrate, a first superconductive layer overlying the first substrate, and a stabilizer layer overlying the first superconductive layer. The article further includes a second superconductive segment comprising a second substrate, a second superconductive layer overlying the second substrate, and a stabilizer layer overlying the second superconductive layer. A joint region comprising a splice is provided to connect the first and second superconductive segments together, the splice comprising superconductive layer but free of one of a stabilizer layer and a substrate.

DETAILED DESCRIPTION

Figure 1:
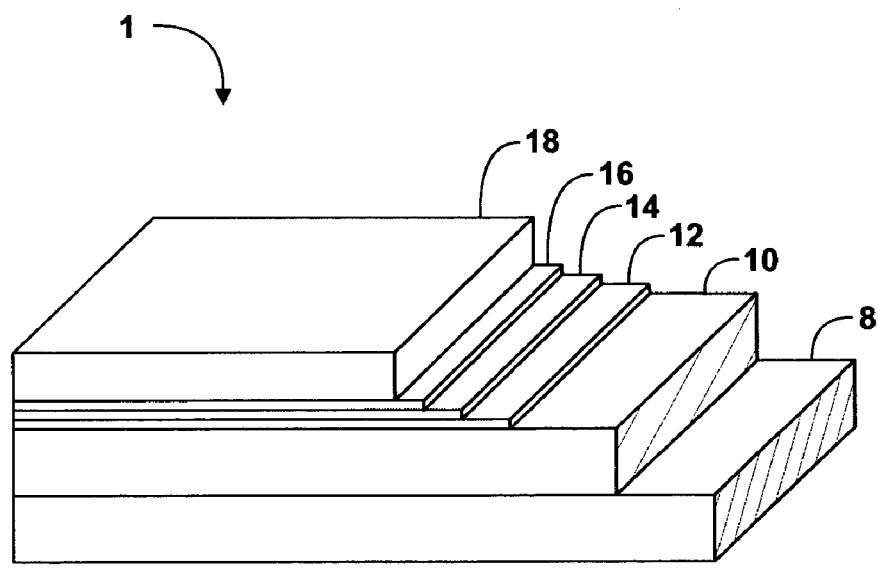
FIG. 1 illustrates a general layered structure of a superconductive tape conductor according to an embodiment of the present invention.

Turning to FIG. 1, the generalized layered structure of a superconductive article according to an embodiment of the present invention is depicted. The superconductive article includes a substrate 10, a buffer layer 12 overlying the substrate 10, a superconductive layer 14, followed by a capping layer 16, typically a noble metal layer, and a stabilizer layer 18, typically a non-noble metal such as copper.

The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductive tape fabrication, which typically will utilize reel-to-reel tape handling.

The substrate 10 is typically in a tape-like configuration, having a high dimension ratio. For example, the width of the tape is generally on the order of about 0.4–10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

In one embodiment, the substrate is treated so as to have desirable surface properties for subsequent deposition of the constituent layers of the superconductive tape. For example, the surface may be lightly polished to a desired flatness and surface roughness. Additionally, the substrate may be treated to be biaxially textured as is understood in the art, such as by the known RABiTS (roll assisted biaxially textured substrate) technique, although embodiments herein typically utilize a non-textured, polycrystalline substrate, such as commercially available nickel-based tapes noted above.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an superconductive layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 100–200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductive layer exists. Accordingly, the buffer layer may further include another buffer film, this one in particular implemented to reduce a mismatch in lattice constants between the superconductive layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The superconductive layer 14 is generally in the form of a high-temperature superconductor (HTS) layer. HTS materials are typically chosen from any of the high-temperature superconducting materials that exhibit superconducting properties above the temperature of liquid nitrogen, 77 K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductive layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductive layer has a thickness on the order of about 1 to about 30 microns, most typically about 2 to about 20 microns, such as about 2 to about 10 microns, in order to get desirable amperage ratings associated with the superconductive layer 14.

The capping layer 16 and the stabilizer layer 18 are generally implemented to provide a low resistance interface and for electrical stabilization to aid in prevention of superconductor burnout in practical use. More particularly, layers 16 and 18 aid in continued flow of electrical charges along the superconductor in cases where cooling fails or the critical current density is exceeded, and the superconductive layer moves from the superconducting state and becomes resistive. Typically, a noble metal is utilized for capping layer 16 to prevent unwanted interaction between the stabilizer layer(s) and the superconductive layer 14. Typical noble metals include gold, silver, platinum, and palladium. Silver is typically used due to its cost and general accessibility. The capping layer 16 is typically made to be thick enough to prevent unwanted diffusion of the components from the stabilizer layer 18 into the superconductive layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

The stabilizer layer 18 is generally incorporated to overlie the superconductive layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electro-less plating, and electroplating. In this regard, the capping layer 16 may function as a seed layer for deposition of copper thereon.

In the particular embodiment shown in FIG. 1, a conductive layer 8 is provided on the backside of the substrate 10, that is, the side opposite the constituent layers of the superconductive article, most notably the active layer (the superconductive layer 14). The conductive layer 8 may be deposited simultaneously or during the same processing sequence during formation of the stabilizer layer 18, and may be formed of the same material, such as copper. The conductive layer 8 is typically electrically conductive (but not superconductive) and may be electrically connected to the stabilizer layer, providing additional stabilization functionality.

While the generalized structure of a superconductive article has been illustrated in connection with FIG. 1, attention is drawn to FIG. 2. illustrating a more detailed view of a superconductive article, particularly, that of a region in which two superconductive segments are joined together to form a superconductive article 200, which may have the basic architecture of the superconductive article 1 illustrated in FIG. 1. Here, similar reference numerals are utilized to denote analogous structural features. Description of the constituent layers is not repeated below; the reader is referred to the detailed description provided about with respect to the constituent layers of the superconductive article.

In more detail, superconductive article 200 includes first and second superconductive segments 1a and 1b, respectively. Segments 1a and 1b include first and second substrates 10a and 10b, on which are disposed a plurality of layers, including first and second buffer layers 12a and 12b, first and second superconductive layers 14a and 14b, first and second capping layers 16a and 16b, and first and second stabilizer layers 18a and 18b. As shown, the first and second segments 1a and 1b are positioned so as to be placed end-to-end. Particularly, the respective ends of the first and second segments are positioned to be in general abutting or near-abutting contact at an interface 202. While a slight gap is shown along the interface 202, the segments may be positioned to be in direct contact with each other.

Figure 2:
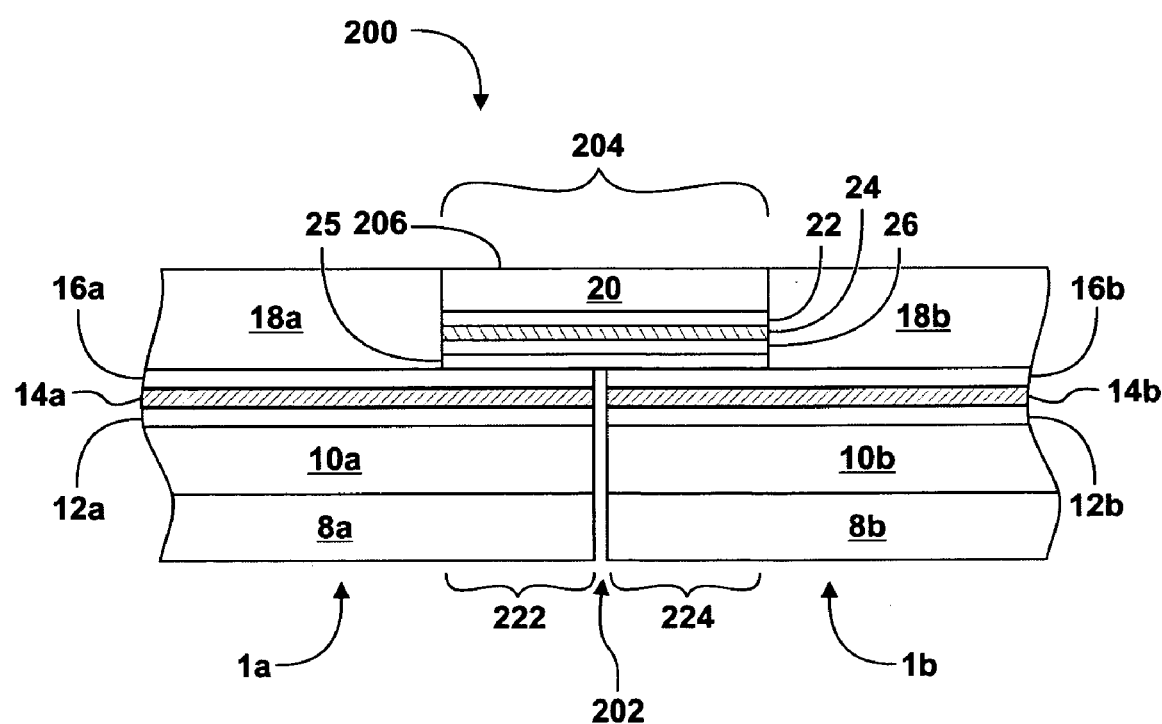
FIG. 2 illustrates an embodiment illustrating a particular structure of a joined superconductive article.

According to a particular feature of the embodiment shown in FIG. 2, the first and second superconductive segments 1a and 1b are electrically and mechanically joined together along a joint region 204. A splice 206 is provided spanning the joint region 204 to provide electrical and mechanical connectivity between the segments. In the particular embodiment shown in FIG. 2, splice 206 includes a layered superconductive structure, generally inverted with respect to the layered structure of the segments. Additionally, the splice 206 is free of a stabilizer layer. More particularly, splice 206 includes a substrate 20, buffer layer 22, superconductive layer 24, capping layer 26, in the general sequence as described. The particular splice 206 may be fabricated according to the basic process flow for forming the superconductive segments, but foregoing the step of forming a stabilizer layer. Alternatively, a completed superconductive structure may be modified to remove the stabilizer layer, and cut into appropriate lengths or coupons to form splice 206.

Splice 206 is bonded to the first and second segments 1a and 1b through use of a bond layer 25. Typically, the bond layer 25 is formed of a solder, such as an Indium solder or a lead-tin solder.

Figure 5:
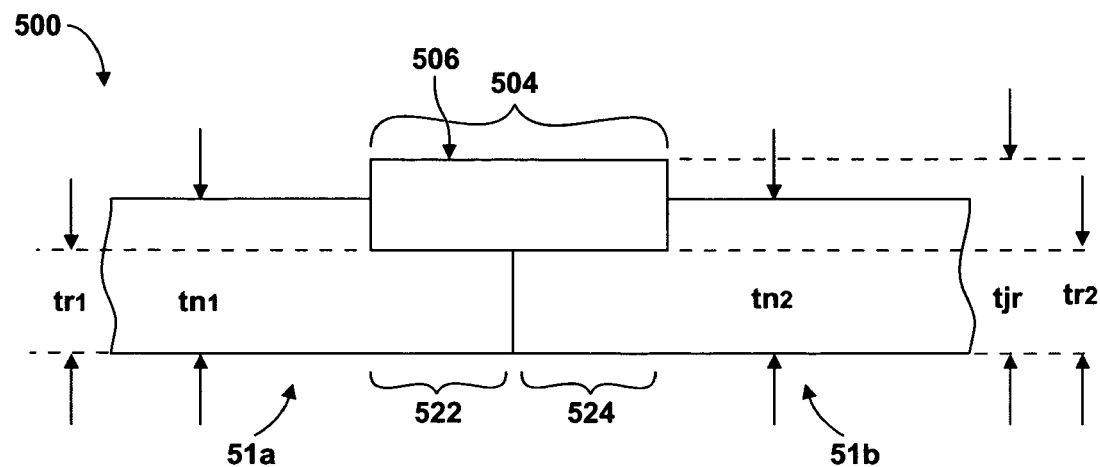
FIG. 5 illustrates a basic architecture according to a joined superconductive article according to yet another embodiment.

In reference to FIGS. 2 and 5, the first and second segments respectively include a first segment end portion 222 and a second segment end portion 224, each of which have a reduced thickness. More particularly, the first segment end portion 222 and the second segment end portion 224 have a reduced thickness $t_{r1}$ and $t_{r2}$ relative to the nominal thicknesses of the first and second superconductive segments. Additional description is provided below in connection with FIG. 5.

Figure 3:
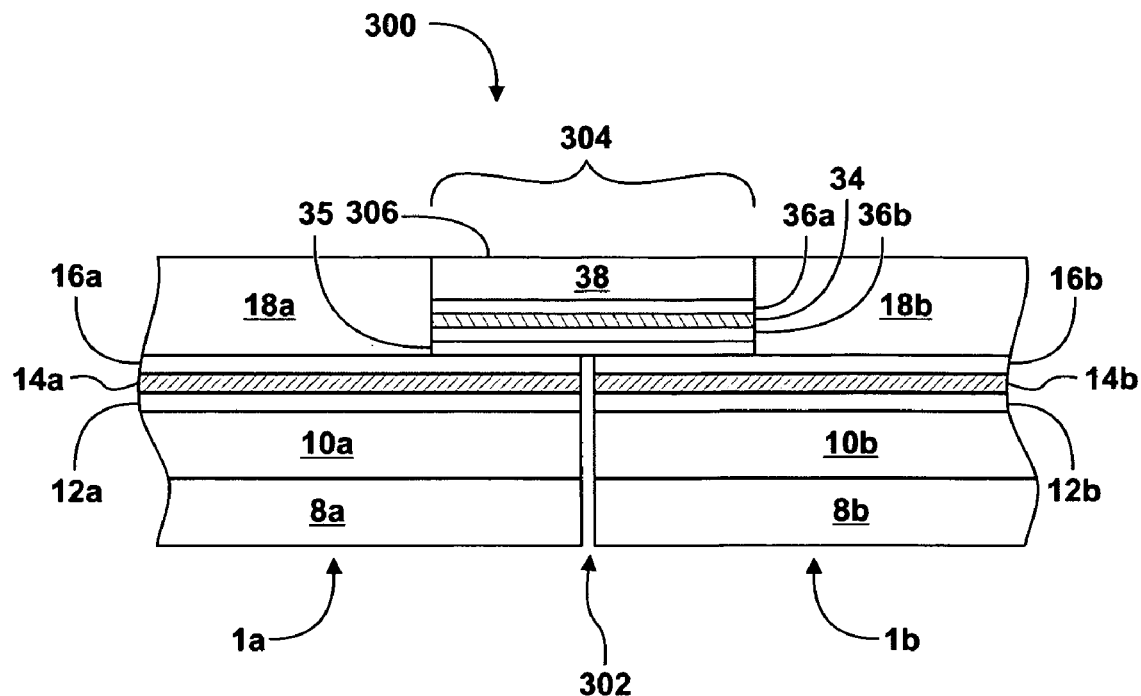
FIG. 3 illustrates another embodiment of a joined superconductive article.

FIG. 3 illustrates yet another embodiment, somewhat similar to the embodiment illustrated in FIG. 2. However, generally speaking, the embodiment shown in FIG. 3 utilizes a different spliced structure, in which the splice does not incorporate a substrate, but rather, incorporates a stabilizer layer. In more detail, superconductive article 300 includes first and second superconductive segments as described in connection with FIG. 2. A splice 306 is provided to span joint region 304. Splice 306 includes a stabilizer layer 38, a capping layer 36a, superconductive layer 34, and a second capping layer 36b. Similarly with respect to the embodiment show in FIG. 2, the splice 306 is bonded to the first and second superconductive segments through use of a bond layer 35.

The particular structure of the splice 306 may be formed in several different manners. For example, a completed superconductive segment portion may be delaminated so as to remove the substrate from the segment portion, by delaminating the structure along the superconductive layer/buffer layer interface. The delaminated structure including the stabilizer layer and the superconductive layer may be optionally then processed so as to deposit a second capping layer on the superconductive layer 34.

Figure 4:
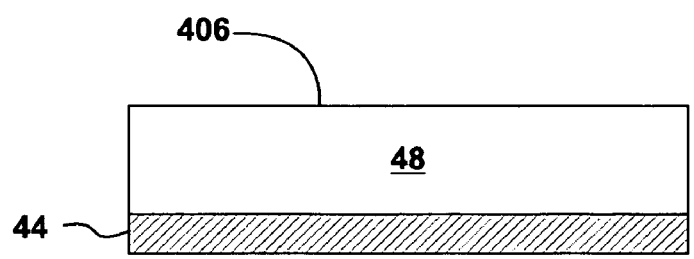
FIG. 4 illustrates a splice according to an embodiment.

FIG. 4 illustrates an even further simplified splice 406, which includes a stabilizer 48 and a superconductive layer 44. The particular splice structure 306 and 406, shown in FIGS. 3 and 4 advantageously utilize a stabilizer layer, improving stabilization of the joint region in practical use. Accordingly, such splice structures may be preferential for particular applications in which joint stabilization is an important parameter.

According to embodiments described herein, the splice generally incorporates a superconductive layer. This particular aspect helps ensure a desirably low joint resistance. Particularly, according to embodiments herein, the superconductive article incorporating joint structures such as those described herein have a joint resistance not greater than about 100 micro-ohms cm$^2$, such as not greater than about 50 micro-ohms cm$^2$, or even not greater than 25 micro-ohms cm$^2$. Additionally, joint resistance may be quantified in terms of heat dissipated, with an upper limit of not greater than 0.5 W/cm$^2$ per joint, such as not greater than 0.25 W/cm$^2$ per joint.

Turning particularly to FIG. 5, various technical features are illustrated in connection with superconductive article 500. Here, superconductive article 500 includes first and second segments 51a and 51b, each having a nominal thickness $t_{n1}$ and $t_{n2}$, respectively. These nominal thicknesses correspond to the thickness of the respective segments along the majority of the length of the segments, particularly excluding the segment end portions, labeled in FIG. 5 as first segment end portion 522 and second segment end portion 524. The first and second segment end portions 522 and 524 respectively have reduced thicknesses, particularly reduced thickness $t_{r1}$ and $t_{r2}$, as illustrated. The reduced thicknesses associated with the end portions may be achieved through various architectural changes in the end portions relative to the main body of the respective segments (having the comparatively thicker nominal thicknesses). For example, the ends of the segments may be etched so as to remove a portion of the stabilizer layer, and in some embodiments, the entirety of the stabilizer layer. Alternatively, during processing, the end portions of the segments may be masked or otherwise left untreated during stabilizer deposition. Typically, the reduced thicknesses associated with the end portions of the segments are not greater than 90%, such as not greater than 80%, or even 70% of the nominal thicknesses of the respective segments. Indeed, in certain embodiments, the thicknesses of the end portions may be at a value not greater than 60% of the respective nominal thicknesses, and in certain embodiments up to about 50%, half the nominal thickness of the superconductive segment. Generally, it is desired that the first and second segments have end portions having reduced thicknesses within about 10% of each other, most typically, the reduced thicknesses being equal to each other, except for minor variations in thickness due to processing control.

Reduction in the thickness of the superconductive segments along the end portions thereof enables formation of relatively low-profile joint regions. In more detail, referring particularly to FIG. 5, the joint region 504 spanning segment end portions 522 and 524 has a thickness $t_{jr}$. Generally, the thickness of the joint region $t_{jr}$ is not greater than at least one of 1.8 $t_{n1}$ and 1.8 $t_{n2}$. Oftentimes the profile of the joint region is not greater than about 1.6 $t_{n1}$ or 1.6 $t_{n2}$. Further, the thickness of the joint region may be further reduced, such as not greater than at least one of 1.5 $t_{n1}$ and 1.5 $t_{n2}$, or not greater than at least one of 1.3 $t_{n1}$ and 1.3 $t_{n2}$. According to one embodiment, the joint thickness is substantially equal to the nominal thickness of at least one of the superconductive segments. While not illustrated in the drawings, the thickness of the joint region may be below that of one of or both the thicknesses of the superconductive segments.

According to embodiments herein, the joined superconductive article may have a relatively long length, particularly having a dimension as already described above in connection with FIG. 1. In addition, the individual segments may also have relatively extended lengths, such as having a dimension ratio not less than about 10, such as not less than about 100, or even 1000 or higher. The superconductive article may include additional superconductive segments, further extending the length and dimension ratio of the article, each segment being joined according to the structures and/or techniques described herein. Extended lengths are particularly suitable for long distance current carrying capability, such traversing an urban area or even traversing extended geographic regions. In addition, a long length, high dimension ratio superconductive article may be particularly advantageous for deployment in coiled or wound structures such as rotating machines and transformers, described below.

According to yet another embodiment, first and second segments having reduced thickness end portions may be directly bonded to each other without incorporation of a splice. In this context, first and second segments may be joined together in an overlapping fashion such that the reduced thickness end portions overlap each other. In this regard, one embodiment contemplates removal of stabilizer material along each of the end portions, followed by inversion of one of the segments and joining. Alternatively, a joined structure would not require inversion of one of the segments. Here, a portion of the stabilizer layer along a first superconductive segment may be removed while removing a portion of the conductive layer and/or the substrate along the end portion of the second superconductive segment, permitting joining of the two segments without inverting either segment. This particular structure may be advantageous for numerous applications, particularly including applications in which superconducting segments are deployed in a wound or coiled structure. Although embodiments described above rely on a splice for joining in contrast to the forgoing alternative embodiments, the alternative embodiments share the concept that superconductive conductors having reduced thickness end segments are utilized to execute a low profile joint.

Noteworthy, as used herein, the term 'superconductive conductor' is utilized to generally denote a superconductive element, such as either a superconductive segment or a splice. That is, the term is used in a generic sense in the present specification and claims.

According to embodiments herein, it should be clear that joined superconductive articles are described utilizing a relatively low-profile joint region. This low-profile joint region may be particularly advantageous for various industrial applications, particularly those that would be sensitive to high profiles or exaggerated profiles along the joint region. Oftentimes, conventional lap joints have undesirable excessive profiles, on the order of two times the nominal thicknesses of each of the superconductive segments. Such a thickness or profile may not be tolerated in various applications, and the mechanical performance of the spliced region according to the state of the art lap joints may be compromised.

Figure 6:
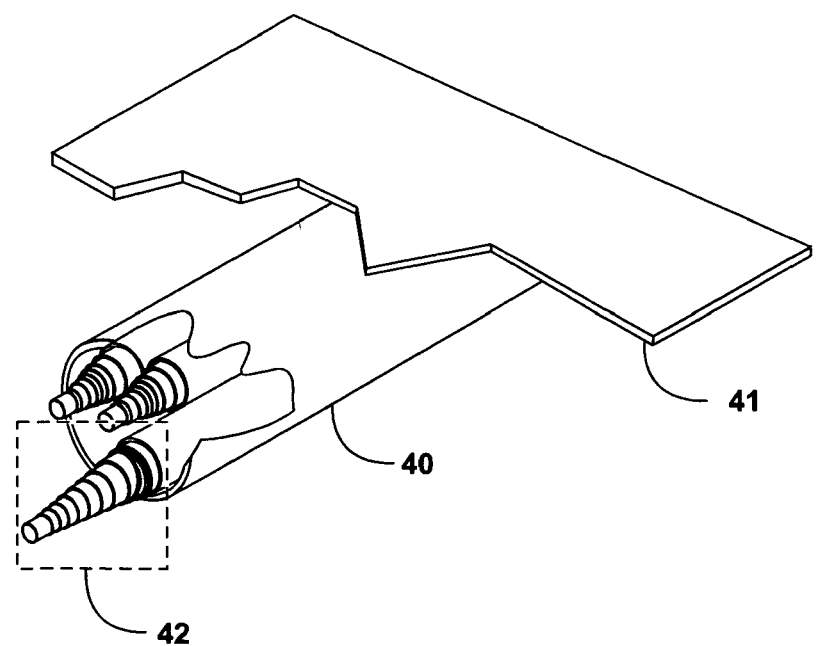
FIGS. 6 and 7 illustrate implementation of a superconducting conductor in a power cable.
Figure 7:
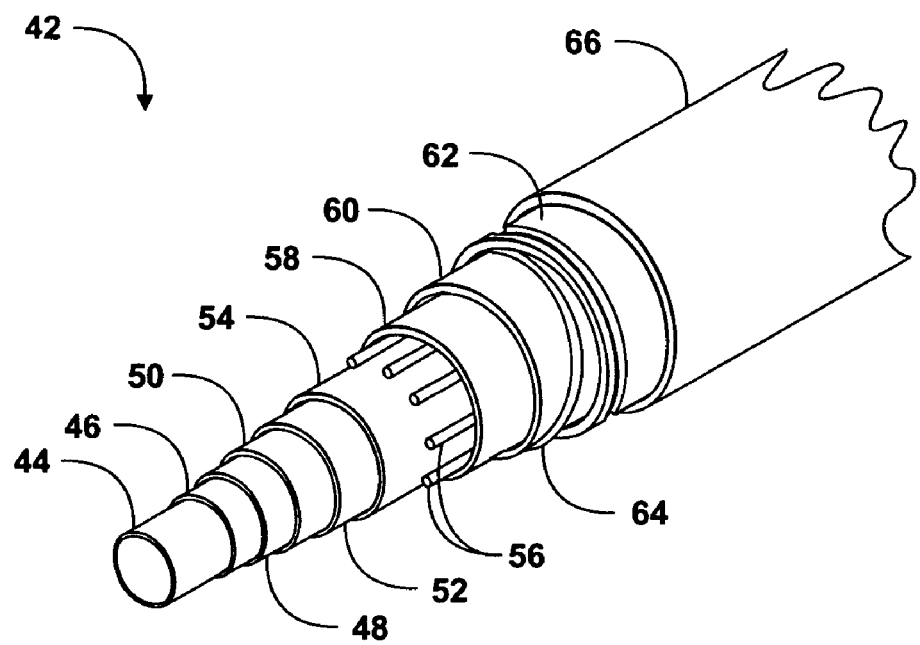

Turning from particular structures of the superconducting conductors, FIGS. 6 and 7 illustrate implementation of a superconducting conductor in a commercial power component, namely a power cable. FIG. 6 illustrates several power cables 42 extending through an underground conduit 40, which may be a plastic or steel conduit. FIG. 6 also illustrates the ground 41 for clarity. As is shown, several power cables may be run through the conduit 40.

Turning to FIG. 7, a particular structure of a power cable is illustrated. In order to provide cooling to maintain the superconductive power cable in a superconducting state, liquid nitrogen is fed through the power cable through LN2 duct 44. One or a plurality of HTS conductors 46 is/are provided so as to cover the duct 44. While conventional tapes are generally placed onto the duct 44 in a helical manner, the conductors according to embodiments of the present invention need not be helically wound, but, in other embodiments, may extend linearly, parallel to the longitudinal axis of the power cable. Further components include a copper shield 48, a dielectric tape 50 for dielectric separation of the components, a second HTS tape 52, a copper shield 54 having a plurality of centering wires 56, a second, larger LN2 duct 58, thermal insulation 60, provided to aid in maintaining a cryogenic state, a corrugated steel pipe 62 for structural support, including skid wires 64, and an outer enclosure 66.

Figure 8:
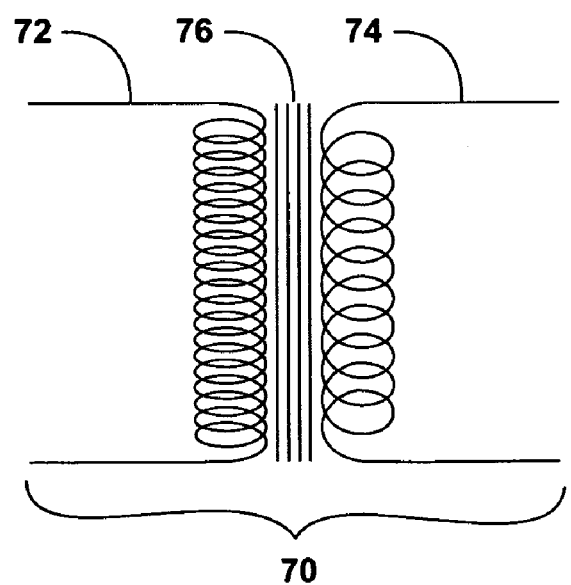
FIG. 8 illustrates schematically a power transformer.

FIG. 8 illustrates schematically a power transformer having a central core 76 around which a primary winding 72 and a secondary winding 74 are provided. It is noted that FIG. 8 is schematic in nature, and the actual geometric configuration of the transformer may vary as is well understood in the art. However, the transformer includes at least the basic primary and secondary windings. In this regard, in the embodiment shown in FIG. 8, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive conductors in accordance with the foregoing description.

Figure 9:
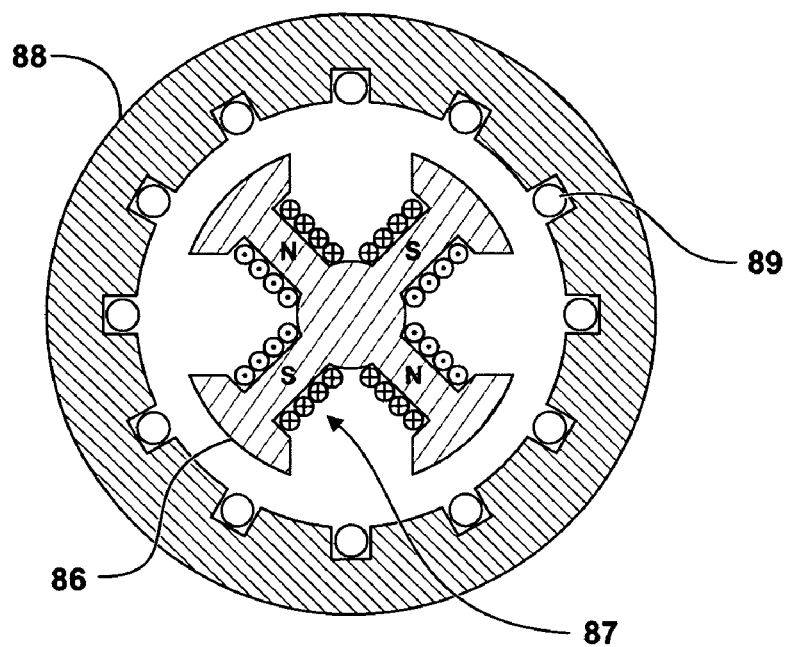
FIG. 9 illustrates the basic structure of a generator.

Turning to FIG. 9, the basic structure of a generator is provided. The generator includes a rotor 86 that is driven as is known in the art, such as by a turbine. Rotor 86 includes high-intensity electromagnets, which are formed of rotor coils 87 that form the desired electromagnetic field for power generation. The generation of the electromagnetic field generates power in the stator 88, which comprises at least one conductive winding 89. According to a particular feature of the embodiment, the rotor coils and/or the stator winding comprises a superconductive conductor in accordance with embodiments described above. Low loss superconductors used in the stator windings generally substantially reduce hysteresis losses.

Figure 10:
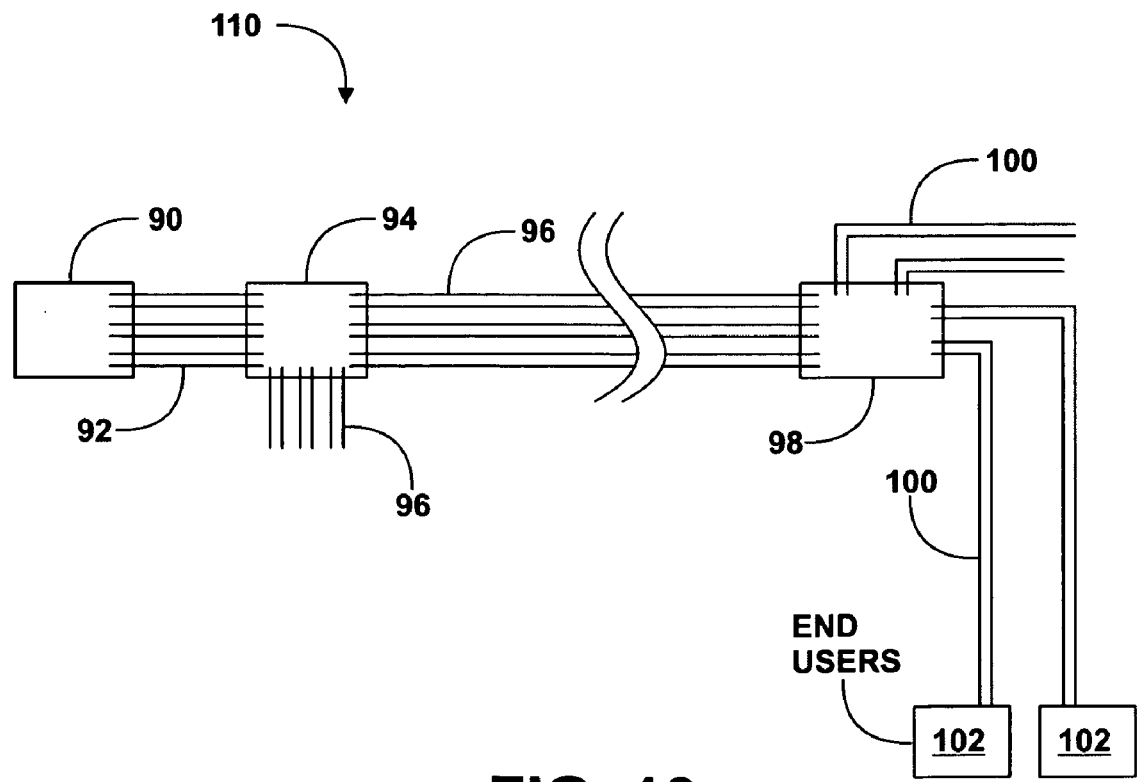
FIG. 10 illustrates a basic schematic of a power grid.

Turning to FIG. 10, a basic schematic of a power grid is provided. Fundamentally, the power grid 110 includes a power plant 90 typically housing a plurality of power generators. The power plant 90 is electrically connected and typically co-located with a transmission substation 94. The transmission substation contains generally a bank of step-up power transformers, which are utilized to step-up voltage of the generated power. Typically, power is generated at a voltage level on the order of thousands of volts, and the transmission substation functions to step-up voltages are on the order of 100,000 to 1,000,000 volts in order to reduce line losses. Typical transmission distances are on the order of 50 to 1,000 miles, and power is carried along those distances by power transmission cables 96. The power transmission cables 96 are routed to a plurality of power substations 98 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 100 to end users 102, which include commercial end users as well as residential end users. It is also noted that individual transformers may be locally provided for individual or groups of end users. According to a particular feature, at least one of the generators provided in the power plant 90, the transformers and the transmission substation, the power transmission cables, the transformers provided in the power substation, and the power distribution cables contain superconductive tapes in accordance with the present description.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A superconducting article, comprising:
a first superconductive segment having a nominal thickness $t_{n1}$;
a second superconductive segment having a nominal thickness $t_{n2}$; and
a joint region comprising a splice connecting the first and second superconductive segments together, the splice overlying portions of both the first and second superconductive segments along the joint region, the joint region having a thickness $t_{jr}$, wherein $t_{jr}$ is not greater than at least one of 1.8 $t_{n1}$ and 1.8 $t_{n2}$.

2. The article of claim 1, wherein the splice comprises a superconductive layer.

3. The article of claim 2, wherein the splice further comprises a stabilizer layer overlying the superconductive layer.

4. The article of claim 2, wherein the splice further comprises a substrate overlying the superconductive layer.

5. The article of claim 1, wherein the $t_{n1}$ is substantially equal to $t_{n2}$.

6. The article of claim 1, wherein $t_{jr}$ is not greater than at least one of 1.6 $t_{n1}$ and 1.6 $t_{n2}$.

7. The article of claim 6, wherein $t_{jr}$ is not greater than at least one of 1.5 $t_{n1}$ and 1.5 $t_{n2}$.

8. The article of claim 1, wherein the first superconductive segment includes a first substrate, a first superconductive layer overlying the first substrate, and a first stabilizer layer overlying the first superconductive layer, and wherein the second superconductive segment includes a second substrate, a second superconductive layer overlying the second substrate, and a second stabilizer layer overlying the second superconductive layer.

9. The article of claim 8, wherein the first and second superconductive segments include first and second buffer layers, respectively, the first buffer layer being provided between the first substrate and the first superconductive layer and the second buffer layer being provided between the second substrate and the second superconductive layer.

10. The article of claim 8, wherein the first and second superconductive layers comprise a high temperature superconductor material, having a critical temperature $T_c$ not less than about 77 K.

11. The article of claim 10, wherein the superconductor material comprises $REBa_2Cu_3O_{7-x}$, wherein RE is a rare earth element.

12. The article of claim 1, wherein the article has a dimension ratio not less than about 100.

13. The article of claim 1, further comprising a bond layer provided between the splice and the first and second superconductive layers.

14. The article of claim 1, wherein the bond layer comprises solder.

15. The article of claim 1, wherein the joint region has a joint resistance of not greater than about 100 micro-ohms $cm^2$.

16. A superconducting article, comprising:

a first superconductive segment having a first segment end portion, the first superconductive segment having a nominal thickness $t_{n1}$ and the first segment end portion having reduced thickness $t_{r1}$ that is less than $t_{n1}$;

a second superconductive segment having a second segment end portion, the second superconductive segment having a nominal thickness $t_{n2}$ and the second segment end portion having reduced thickness $t_{r2}$ that is less than $t_{n2}$, wherein the first and second end portions are bonded together at a joint region, the joint region having a thickness $t_{jr}$ that is not greater than at least one of 1.8 $t_{n1}$ and 1.8 $t_{n2}$, wherein the joint region comprises a splice connecting the first and second superconductive segments together, the splice overlying the first and second segment end portions.

17. A superconducting article, comprising:

a first superconductive conductor having a nominal thickness $t_{n1}$; and a second superconductive conductor overlying the first conductor along a joint region, the joint region having a thickness not greater than 1.8 $t_{n1}$.

18. The article of claim 17, wherein the first superconductive conductor is a first superconductive segment, and the second superconductive conductor is a splice.

19. The article of claim 18, further comprising a second superconductive segment, the splice overlying both first and second superconductive segments and the joint region spanning both the first and second segments.

* * * * *